United States Patent
Madia

(10) Patent No.: US 12,021,137 B2
(45) Date of Patent: Jun. 25, 2024

(54) Ni(Al)O P-TYPE SEMICONDUCTOR VIA SELECTIVE OXIDATION OF NiAl AND METHODS OF FORMING THE SAME

(71) Applicant: Taiwan Semiconductor Manufacturing Company Limited, Hsinchu (TW)

(72) Inventor: Oreste Madia, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 137 days.

(21) Appl. No.: 17/578,569

(22) Filed: Jan. 19, 2022

(65) Prior Publication Data

US 2023/0029647 A1   Feb. 2, 2023

Related U.S. Application Data

(60) Provisional application No. 63/227,038, filed on Jul. 29, 2021.

(51) Int. Cl.
| | |
|---|---|
| *H01L 29/66* | (2006.01) |
| *H01L 21/02* | (2006.01) |
| *H01L 21/44* | (2006.01) |
| *H01L 29/49* | (2006.01) |
| *H01L 29/786* | (2006.01) |

(52) U.S. Cl.
CPC .. *H01L 29/66969* (2013.01); *H01L 21/02496* (2013.01); *H01L 21/02565* (2013.01); *H01L 21/02614* (2013.01); *H01L 21/44* (2013.01); *H01L 29/4908* (2013.01); *H01L 29/78642* (2013.01); *H01L 29/7869* (2013.01); *H01L 21/02381* (2013.01); *H01L 21/02422* (2013.01); *H01L 21/02488* (2013.01)

(58) Field of Classification Search
CPC ........ H01L 21/02496; H01L 21/02614; H01L 29/78642; H01L 29/78696; H01L 29/66969; H01L 21/02565; H01L 21/44; H01L 29/4908; H01L 29/7869; H01L 21/02381; H01L 21/02422; H01L 21/02488

See application file for complete search history.

(56) References Cited

U.S. PATENT DOCUMENTS

| | | | |
|---|---|---|---|
| 7,655,989 B2 * | 2/2010 | Zhu | H01L 27/1211 257/288 |
| 10,672,671 B2 * | 6/2020 | Ando | H01L 29/1054 |
| 2009/0315124 A1 * | 12/2009 | Chen | H10B 99/00 257/411 |
| 2011/0278590 A1 * | 11/2011 | Mieczkowski | H01L 29/66871 257/256 |

(Continued)

*Primary Examiner* — William B Partridge
*Assistant Examiner* — David Paul Sedorook
(74) *Attorney, Agent, or Firm* — The Marbury Law Group, PLLC

(57) ABSTRACT

A method of forming a semiconductor device may include depositing a NiAl layer on a substrate, oxidizing the NiAl layer to form a bilayer including a NiO semiconducting material layer and an $AlO_x$ layer on the NiO semiconducting material layer, forming a semiconductor layer including the NiO semiconducting material layer, the semiconductor layer also including a channel region, and forming a gate dielectric on the channel region of the semiconductor layer.

20 Claims, 9 Drawing Sheets

(56) References Cited

U.S. PATENT DOCUMENTS

| | | | |
|---|---|---|---|
| 2011/0316414 A1* | 12/2011 | Nendai | H05B 33/10 |
| | | | 313/504 |
| 2018/0342513 A1* | 11/2018 | Lu | H01L 29/66795 |
| 2020/0098930 A1* | 3/2020 | Le | H01L 29/458 |
| 2020/0105892 A1* | 4/2020 | Haratipour | H01L 23/5329 |
| 2020/0185504 A1* | 6/2020 | Sharma | H01L 29/78606 |
| 2020/0273962 A1* | 8/2020 | Pillarisetty | H01L 29/516 |
| 2020/0295130 A1* | 9/2020 | Bi | H01L 29/785 |

* cited by examiner

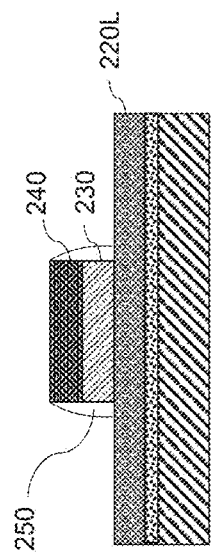
FIG. 3E
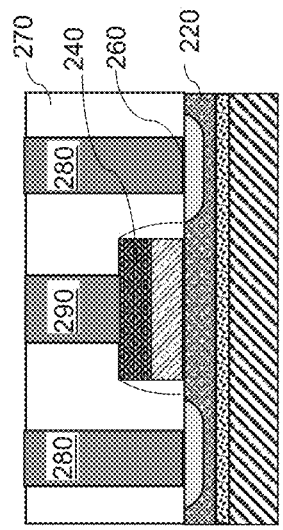
FIG. 3F
FIG. 3G
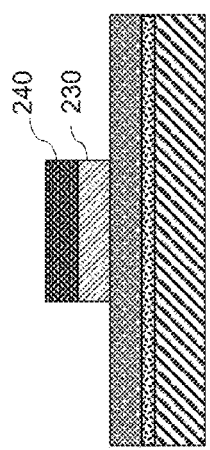
FIG. 3H

Ni(Al)O P-TYPE SEMICONDUCTOR VIA SELECTIVE OXIDATION OF NiAl AND METHODS OF FORMING THE SAME

RELATED APPLICATIONS

This application claims the benefit of priority from U.S. Provisional Application No. 63/227,038, entitled "Ni(Al)O p-type semiconductor via selective oxidation of NiAl and methods of forming the same" filed on Jul. 29, 2021, the entire contents of which are incorporated herein by reference for all purposes.

BACKGROUND

NiO semiconducting layers (e.g., p-type semiconducting layers) have been deposited via a variety of techniques. However, achieving the composition required for a sufficient conductivity (e.g., p-type conductivity) can be cumbersome.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3E illustrates an intermediate structure of the exemplary semiconductor device in which the conductive layer and the AlOx layer is patterned, according to one or more embodiments.

FIG. 3F illustrates an intermediate structure of the exemplary semiconductor device in which the sidewall spacers is formed on a sidewall of the gate dielectric and gate electrode, according to one or more embodiments.

FIG. 3G illustrates an intermediate structure of the exemplary semiconductor device in which the source region and the drain region is formed, according to one or more embodiments.

FIG. 3H illustrates an intermediate structure of the exemplary semiconductor device in which the dielectric layer (e.g., interlayer dielectric), the source contact and the drain contact and gate contact are formed, according to one or more embodiments.

DETAILED DESCRIPTION

Figure 1:
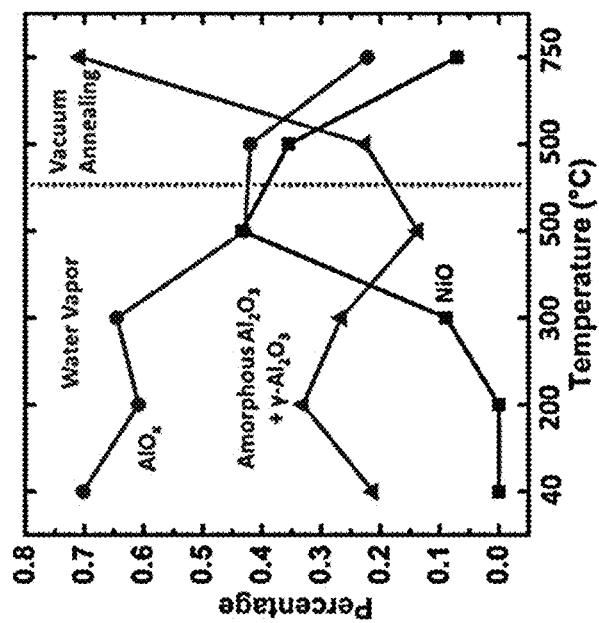
FIG. 1 is a graph which shows a percentage of three products that may be produced by the oxidation of NiAl (e.g., AlOx, amorphous $Al_2O_3+\gamma-Al_2O_3$, and NiO) over a range of oxidation temperatures, according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

One or more embodiments of the present invention may provide p-type semiconducting nickel oxide (NiO) via selective oxidation of NiAl (e.g., NiAl metal). In particular, one or more embodiments may provide a Ni(Al)O p-type semiconductor (e.g., a NiO/AlOx bilayer) via selective oxidation of NiAl.

Oxidation of NiAl may lead to selective oxidation of Al. In embodiments in which the oxidation is carried out in a water vapor-saturated environment, the oxidation may favor the formation of a NiO layer (e.g., a NiO thin layer) beneath an AlOx superficial layer. Such a NiO layer may be used as semiconducting oxide layer. Semiconducting oxides of p-type nature may provide for fully back end of line (BEOL) complementary metal oxide semiconductor (CMOS) devices.

FIG. 1 is a graph which depicts a percentage of three products that may be produced as a result of the oxidation of NiAl (e.g., AlOx, amorphous $Al_2O_3+\gamma-Al_2O_3$, and NiO) over a range of oxidation temperatures, according to one or more embodiments. As shown in FIG. 1, an oxidation temperature of about 450° C. may produce a NiO/AlOx bilayer including approximately equal amounts of AlOx and NiO. About 10% of the total stack may include an amorphous $Al_2O_3+\gamma-Al_2O_3$ dielectric material on top. Alternatively, the oxidation temperature could be maintained around 300° C. and the oxidation could be performed in multiple steps.

One or more embodiments may use an anneal sequence in order to fabricate a NiO semiconducting layer (e.g., p-type semiconducting layer). The process may naturally provide a NiO/AlOx bilayer that may be engineered to serve as channel/gate dielectric stack in a field-effect transistor.

In particular, a NiAl layer may be deposited on a substrate by a variety of processes. The NiAl layer may then be oxidized (e.g., by water-based oxidation) to form an AlOx/NiO bilayer. The AlOx/NiO bilayer may then be processed (e.g., by etching) to form the channel/gate dielectric of the field effect transistor.

The NiO semiconducting layer may have an "oxygen-poor" composition (e.g., Ni:O ratio of greater than 1:1) that may lead to increased hole mobility. Alternatively, the NiO semiconducting layer may have a "Ni-poor" composition (e.g., Ni:O ratio of less than 1:1) that may also lead to increased hole mobility. The "Ni-poor" composition may be attained, for example, by tuning the annealing so that the oxidation is skewed towards the formation of aluminum oxide, leaving less oxygen to bond with nickel. Thus, in one or more embodiments of the present invention, the selective oxidation of NiAl may be used to provide either an oxygen-poor composition of NiO or a Ni-poor composition of NiO.

There may be many advantages and benefits provided by the embodiments of the present invention. In particular, the embodiments of the present invention may provide a method of fabricating a p-type NiO semiconductor layer with enhanced hole mobility. The embodiments of the present invention may also provide both a channel (e.g., the NiO layer) and a gate dielectric (e.g., the AlOx layer) with only one process step.

Figure 2:
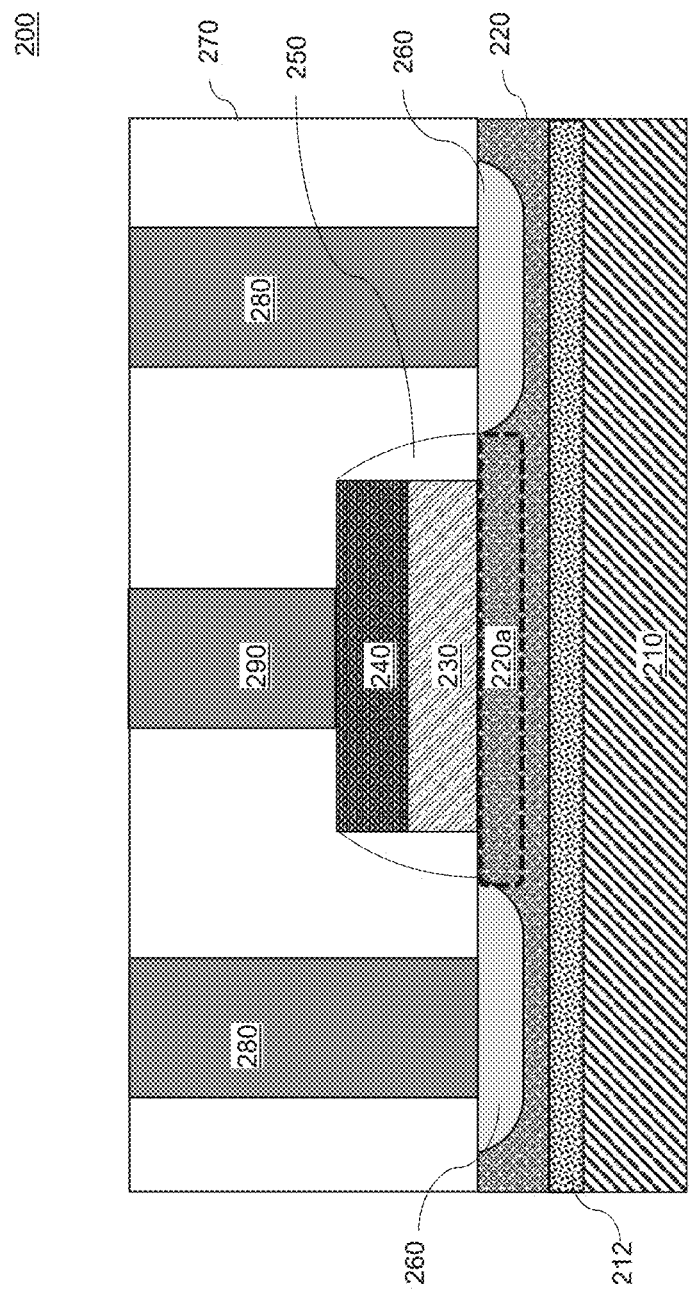
FIG. 2 illustrates an exemplary semiconductor device, according to one or more embodiments.

FIG. 2 illustrates a semiconductor device 200, according to one or more embodiments. The semiconductor device 200 may include, for example, a metal-oxide-semiconductor field-effect transistor (MOSFET), and in particular, a thin-film transistor (TFT) (e.g., a planar TFT). The TFT may be used, for example, in a complementary metal oxide semiconductor (CMOS) device. The TFT may also include a transparent TFT that may be used, for example, in an electronic device such as a solar cell, solid-state sensor, flat-panel display, smart window, electrochromic device, transparent flexible electronic device, etc.

The semiconductor device 200 may include a substrate 210. The substrate 210 may include a semiconductor substrate such as single-crystalline semiconductor material or a compound semiconductor material. The substrate 210 may include, for example, silicon, germanium, silicon germanium or glass. An insulating layer 212 that may include, for example, silicon dioxide, may be formed on the substrate 210. The insulating layer 212 may include a buried oxide (BOX) layer. Other suitable insulating materials are within the contemplated scope of disclosure.

The semiconductor device 200 may also include a semiconductor layer 220 on the insulating layer 212. The semiconductor layer 220 may be composed of a NiO semiconducting material layer (e.g., p-type semiconducting layer). In particular, the semiconductor layer 220 may be composed entirely of the NiO semiconducting layer.

The NiO semiconducting material layer may have a thickness in a range from 1 nm to 50 nm. In particular, for at least one targeted application (e.g., a TFT), a thickness of the NiO semiconducting material layer (e.g., a thickness of the semiconductor layer 220) may be in the range from 1 nm to 10 nm. The NiO semiconducting material layer may have an "oxygen-poor" composition (e.g., Ni:O ratio of greater than 1:1) that may lead to increased hole mobility. Alternatively, the NiO semiconducting material layer may have a "Ni-poor" composition (e.g., Ni:O ratio of less than 1:1) that may also lead to increased hole mobility.

The semiconductor device 200 may also include a gate structure on a channel region 220a of the semiconductor layer 220. The gate structure may include a gate dielectric 230 that may be formed on a surface of the semiconductor layer 220. The gate dielectric 230 may include, for example, an AlOx layer that may be formed together with the NiO layer of the semiconductor layer 220 by selective oxidation of a NiAl layer.

The gate structure may also include a gate electrode 240 on the gate dielectric 230. In particular, the gate electrode 240 may include a metal gate electrode that may include one or more metal layers including, for example, tungsten, titanium, tantalum, aluminum, cobalt, nickel and composites of these materials (e.g., WN, TiN and TaN). Alternatively, the gate electrode 240 may include a non-metal conductive material such as polysilicon or transparent conductive oxide (e.g., indium tin oxide).

The gate structure may also include sidewall spacers 250 formed on opposing sidewalls of the gate dielectric 230 and the gate electrode 240. The sidewall spacers 250 may include, for example, silicon nitride or silicon oxynitride.

The semiconductor device 200 may also include source and drain regions 260 formed within the semiconductor layer 220. In embodiments in which the semiconductor layer 220 is a p-type layer (e.g., a NiO p-type semiconducting layer), the source and drain regions 260 may include an n-type dopant implanted therein. Examples of n-type dopants that may be implanted in the source and drain regions 260 may include phosphorus, arsenic, antimony, bismuth and lithium. Further, a p-type channel region 220a may be located in the semiconductor layer 220 between the source and drain regions 260.

The semiconductor device 200 may also include a dielectric layer 270 such as an inter-layer dielectric layer. The dielectric layer 270 may be formed on the gate electrode 240, sidewall spacers 250, the semiconductor layer 220 and the source and drain regions 260. The dielectric layer 270 may include, for example, silicon nitride, silicon oxide, fluorinated $SiO_2$ (FSG), hydrogenated silicon oxycarbide (SiCOH), porous SiCOH, boro-phospho-silicate glass (BPSG), silsesquioxanes, thermosetting polyarylene ethers, and spin-on silicon-carbon containing polymer materials. The dielectric layer 270 may also include a high dielectric constant (high-k) material that may include a metal oxide such as tantalum oxide, barium titanium oxide, hafnium oxide, and aluminum oxide.

Source and drain contact vias 280 may be formed in the dielectric layer 270 and contact the source and drain regions 260 (e.g., an upper surface of the source and drain regions 260). A gate contact via 290 may also be formed in the dielectric layer 270 and contact the gate electrode 240 (e.g., an upper surface of the gate electrode 240). The source and drain contact vias 280 and the gate contact via 290 may be composed of a metal or metal alloy or composite metal including, for example, aluminum, tungsten, nickel, titanium, copper, cobalt, indium, gold, platinum, erbium and ytterbium.

FIGS. 3A-3G illustrate a method of making the semiconductor device 200, according to one or more embodiments.

Figure 3B:
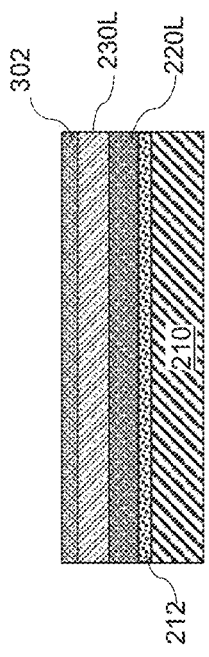
FIG. 3B illustrates an intermediate structure of the exemplary semiconductor device in which the NiAl layer is oxidized, according to one or more embodiments.
Figure 3D:
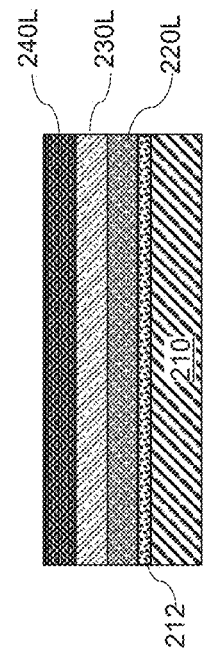
FIG. 3D illustrates an intermediate structure of the exemplary semiconductor device in which a conductive layer is formed on the AlOx layer, according to one or more embodiments.
Figure 3A:
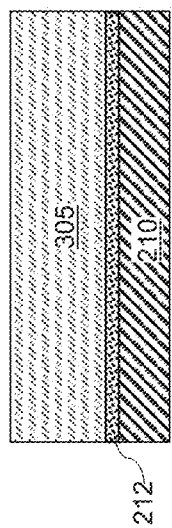
FIG. 3A illustrates an intermediate structure of the exemplary semiconductor device including a NiAl layer on the insulating layer, according to one or more embodiments.

FIG. 3A illustrates an intermediate structure of the exemplary semiconductor device 200 including a NiAl layer 305 on the insulating layer 212, according to one or more embodiments. The insulating layer 212 may include, for example, silicon dioxide and may be formed by deposition (e.g., CVD, ALD, PVD) onto the substrate 210. Alternatively, the insulating layer 212 may include a BOX layer that may be formed, for example, by separation by implantation of oxygen (SIMOX) process.

In one or more embodiments, the NiAl layer 305 may be deposited on the insulating layer 212 via a variety of that may include, for example, chemical vapor deposition (CVD), atomic layer deposition (ALD), physical vapor deposition (PVD), plasma-enhanced chemical vapor deposition (PECVD), plasma-enhanced atomic layer deposition (PEALD), and metal-organic chemical vapor deposition (MOCVD). A thickness of the NiAl layer 305 may be, for example, in a range from about 5 nm to 100 nm. Although, thicker or thinner NiAl layer 305 may be used. The thickness of the initial NiAl layer 305 may depend on the composition of the NiO semiconducting layer (e.g., semiconductor layer 220) sought by oxidation of the NiAl layer 305, and the number of oxidation steps that may be performed.

FIG. 3B illustrates an intermediate structure of the exemplary semiconductor device 200 in which the NiAl layer 305 may be oxidized, according to one or more embodiments. The NiAl layer 305 may be oxidized, for example, in a water vapor atmosphere between 300° C. and 500° C. As an alternative to water vapor oxidation, the NiAl layer 305 may be oxidized by performing an annealing process such as an $O_2$ anneal and/or an $O_3$ anneal. Depending on the chosen temperature, choice of oxidant, initial thickness of the NiAl layer 305, and final specification of the semiconductor layer 220, a duration of the annealing step (e.g., oxidation of NiAl layer 305) may be in a range from 15 minutes to 2 hours.

As illustrated in FIG. 3B, the oxidation of the NiAl layer 305 may transform the NiAl layer 305 into three layers including the NiO semiconducting layer 220L, an $AlO_x$ layer 230L, and an $Al_2O_3$ layer 302 that may include amorphous $Al_2O_3+\gamma\text{-}Al_2O_3$. The NiO semiconducting layer 220L may be subsequently processed into the semiconductor layer 220. The $AlO_x$ layer 230L may be subsequently processed into the dielectric layer 230. The Ni:O ratio of the NiO semiconducting layer 220L may be in a first range between 1:1 and 1.5:1 or in a second range of between 1:1.5 and 1:1.

A thickness of the NiO semiconducting layer 220L may be in a range from 1 nm to 10 nm. A thickness of the $AlO_x$ layer 230L may also be in a range from 1 nm to 10 nm. Although, thicker or thinner $AlO_x$ 230L may be used. In addition, the thickness of the NiO semiconducting layer 220L may be substantially equal to the thickness of the $AlO_x$ layer 230L.

Figure 3C:
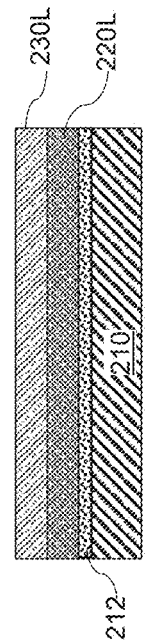
FIG. 3C illustrates an intermediate structure of the exemplary semiconductor device in which the $Al_2O_3$ layer is removed, according to one or more embodiments.

FIG. 3C illustrates an intermediate structure in which the $Al_2O_3$ layer 302 has been removed, according to one or more embodiments. The $Al_2O_3$ layer 302 may be removed, for example, by performing an etching process. The etching process may include a dry etching process or wet etching process. The etching process may be performed until the $Al_2O_3$ layer 302 is removed and a surface of the $AlO_x$ layer 230L is exposed. In some embodiments, a chemical mechanical polish (CMP) process may be performed in lieu of the etching process to remove the $Al_2O_3$ layer 302.

A treatment may be performed on the $AlO_x$ layer 230L in order to improve the dielectric performance of the $AlO_x$ layer 230L. The treatment may include, for example, an oxygen-containing anneal (e.g., an $O_2$ anneal and/or an $O_3$ anneal), or an oxygen-containing plasma anneal. The treatment may increase the dielectric constant and improve the thermal and electric stability of the $AlO_x$ layer 230L.

FIG. 3D illustrates an intermediate structure of the exemplary semiconductor device 200 in which a conductive layer 240L may be formed on the $AlO_x$ layer 230L, according to one or more embodiments. The conductive layer 240L may be processed to form the gate electrode 240 in the semiconductor device 200. The conductive layer 240L may include one or more metal materials including, for example, tungsten, titanium, tantalum, aluminum, cobalt, nickel and composites of these materials (e.g., WN, TiN and TaN), or a non-metal conductive material such as polysilicon or transparent conductive oxide (e.g., indium tin oxide). The conductive layer 240L may be deposited, for example, by processes such as chemical vapor deposition (CVD), atomic layer deposition (ALD), physical vapor deposition (PVD), plasma-enhanced chemical vapor deposition (PECVD), plasma-enhanced atomic layer deposition (PEALD), and metal-organic chemical vapor deposition (MOCVD).

FIG. 3E illustrates an intermediate structure of the exemplary semiconductor device 200 in which the conductive layer 240L and the $AlO_x$ layer 230L may be patterned, according to one or more embodiments. The conductive layer 240L and the $AlO_x$ layer 230L may be patterned by performing a photolithographic process. The photolithographic process may include the following steps: 1) a photoresist layer may be formed on the conductive layer 240L; 2) using an optical mask, the photoresist layer may be exposed to a pattern of light; 3) the photoresist layer may be developed to pattern the photoresist layer; 4) an etching process (e.g., wet etching process or dry etching process) may be performed to transfer the pattern of the patterned photoresist layer to the conductive layer 240L and the $AlO_x$ layer 230L; and 5) the patterned photoresist layer may be removed (e.g., by ashing). The patterning step may transform the conductive layer 240L into the gate electrode, and transform the $AlO_x$ layer 230L into the gate dielectric.

FIG. 3F illustrates an intermediate structure of the exemplary semiconductor device 200 in which the sidewall spacers 250 may be formed on a sidewall of the gate dielectric 230 and gate electrode 240, according to one or more embodiments. The sidewall spacers 250 may be formed for example, by depositing an insulating film such as an SiN film or SiON film on gate electrode 240, the sidewalls of the gate electrode 240 and gate dielectric 230, and on the upper surface of the NiO semiconducting layer 220L. The insulating film may be deposited, for example, by chemical vapor deposition, and may have a thickness in a range from 20 nm to 40 nm. An overall anisotropic etch back may then be applied to the insulating film (e.g., by reactive ion etching (RIE) to transform the insulating film into the sidewall spacers 250.

FIG. 3G illustrates an intermediate structure of the exemplary semiconductor device 200 in which the source and drain regions 260 may be formed, according to one or more embodiments. The source and drain regions 260 may be formed, for example, by implanting ions in the NiO semiconducting layer 220L. In embodiments in which the NiO semiconducting layer 220L is a p-type layer, the source and drain regions 260 may be formed by implanting n-type ions such as ions of phosphorus, arsenic, antimony, bismuth and lithium. The formation of the source and drain regions 260 may transform the NiO semiconducting layer 220L into the semiconductor layer 220.

FIG. 3H illustrates an intermediate structure of the exemplary semiconductor device 200 in which the dielectric layer 270 (e.g., interlayer dielectric), source and drain contacts 280 and gate contact 290 may be formed, according to one or more embodiments. The dielectric layer 270 may be formed, for example, by depositing a dielectric material (e.g., SiN, SiO, FSG, BPSG, etc.) on the gate electrode 240, sidewall spacers 250, the semiconductor layer 220 and the source and drain regions 260. The depositing of the dielectric material may be by CVD, ALD, PVD, etc. A thickness of the dielectric layer 270 may be greater than a combined thickness of the gate dielectric 230 and the gate electrode 240.

The source and drain contacts 280 and gate contact 290 may be formed in the dielectric layer 270, for example, in the same process. In particular, a photolithographic process may be used to form contact holes in the dielectric layer 270. A metal material layer (e.g., a layer of metal, metal alloy or composite metal) may be deposited (e.g., by CVD, ALD, PVD, etc.) on the dielectric layer 270 and in the contact holes. An excess part of the metal material layer on the dielectric layer 270 may then be removed such as by etching (e.g., wet etching, dry etching). This may complete the formation of the semiconductor device 200.

In a first alternative embodiment method that is similar to the embodiment method described above with respect to FIGS. 3A-3H, the oxidation of the NiAl layer 305 (e.g., see FIG. 3A) may be carried out in a water vapor atmosphere at about 300° C. In particular, the temperature may be no greater than 300° C. The oxidation may also result in the formation of the NiO semiconducting layer 220L and the AlO$_x$ layer 230L as illustrated in FIG. 3B. After the Al$_2$O$_3$ layer 302 is etched away (e.g., see FIG. 3C), a further oxidation may be performed on the NiO semiconducting layer 220L and the AlO$_x$ layer 230L. The further oxidation may form more additional Al$_2$O$_3$ material on the AlO$_x$ layer 230L. This further oxidation may occur by drawing oxygen from the underlying NiO semiconducting layer 220L. The further oxidation may increase the Ni:O ratio of the NiO semiconducting layer 220L with potential benefits on the hole mobility of the semiconductor layer 220 in the finished semiconductor device 200.

The further oxidation may be performed, for example, in the same temperature ranges as the first oxidation step described above (e.g., see FIG. 3B). The mechanism to be activated by the further oxidation may include the same mechanism as in the first oxidation step. By performing both the first oxidation step and further oxidation step, it may be realistically possible to achieve a 2:1 Ni:O ratio in the NiO semiconducting layer 220L.

After the further oxidation, this first alternative embodiment method may continue with the treatment of the AlO$_x$ layer 230L to improve the dielectric performance of the AlOx layer 230L. Subsequent processing may then continue as described above with respect to FIGS. 3D-3H to produce the semiconductor device 200.

Figure 4B:
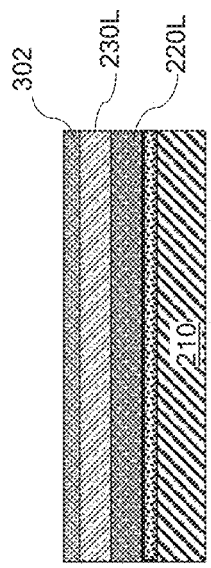
FIG. 4B illustrates an intermediate structure of the exemplary semiconductor device in which the NiAl layer is oxidized, according to one or more embodiments.
Figure 4D:
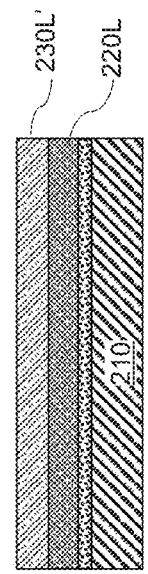
FIG. 4D illustrates an intermediate structure of the exemplary semiconductor device in which a dielectric material layer is formed on the NiO semiconducting layer, according to one or more embodiments.
Figure 4A:
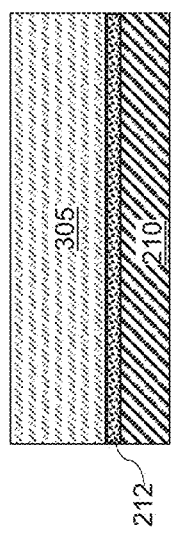
FIG. 4A illustrates an intermediate structure of the exemplary semiconductor device including a NiAl layer, according to one or more embodiments.

FIGS. 4A-4D illustrate a second alternative embodiment method that is similar to the method described above with respect to FIGS. 3A-3H, according to one or more embodiments. FIG. 4A illustrates an intermediate structure including a NiAl layer 305, according to one or more embodiments. The NiAl layer 305 may be formed on the insulating layer 212 as described above with respect to FIG. 3A. FIG. 4B illustrates an intermediate structure in which the NiAl layer 305 may be oxidized, according to one or more embodiments. The NiAl layer 305 may be oxidized as described above with respect to 3B.

Figure 4C:
FIG. 4C illustrates an intermediate structure of the exemplary semiconductor device in which the $Al_2O_3$ layer and the AlOx layer are removed, according to one or more embodiments.

FIG. 4C illustrates an intermediate structure in which the Al$_2$O$_3$ layer 302 and the AlO$_x$ layer 230L may be removed, according to one or more embodiments. That is, in contrast to the embodiment method illustrated in FIGS. 3A-3H in which only the Al$_2$O$_3$ layer 302 may be removed, in the second alternative embodiment method, both the Al$_2$O$_3$ layer 302 and the AlO$_x$ layer 230L may be removed, for example, by performing an etching process or CMP. The etching process may include a dry etching process or wet etching process. The etching process may be performed until the Al$_2$O$_3$ layer 302 and the AlO$_x$ layer are removed and a surface of the NiO semiconducting layer 220L may be exposed.

FIG. 4D illustrates an intermediate structure in which a dielectric material layer 230L' may be formed on the NiO semiconducting layer 220L, according to one or more embodiments. The dielectric material layer 230L' may include, for example, SiO$_2$, or a high-k dielectric material. The term "high-k dielectric material" may be construed to mean a dielectric material having a dielectric constant, k, greater than about 4.0, which is greater than the dielectric constant of SiO$_2$. For example, the high-k dielectric material may include hafnium oxide (HfO$_2$), which has a dielectric constant that is in a range from approximately 18 to approximately 40. Alternatively, the high-k dielectric material may include ZrO$_2$, Y$_2$O$_3$, La$_2$O$_5$, Gd$_2$O$_5$, TiO$_2$, Ta$_2$O$_5$, HfErO, HfLaO, HfYO, HfGdO, HfAlO, HfZrO, HfTiO, HfTaO, SrTiO, or a combination of one or more of these.

The dielectric material layer 230L' may be formed, for example, by deposition such as by CVD, ALD, PVD, etc. A thickness of the dielectric material layer 230L' may be about the same as a thickness of the NiO semiconducting layer 220L. In particular, the thickness of the dielectric material layer 230L' may be in a range from 1 nm to 10 nm, although thicker or thinner layers may be formed.

After forming the dielectric material layer 230L', processing may then continue as described above with respect to FIGS. 3D-3H. The structure of the semiconductor device 200 resulting from the second alternative method may be substantially the same as the structure resulting from the method of FIGS. 3A-3H. However, the materials may be different. That is, the gate dielectric 220 resulting from the second alternative method may be composed of a material of the dielectric material layer 230L' instead of a material of the AlOx layer 230L.

Figure 5:
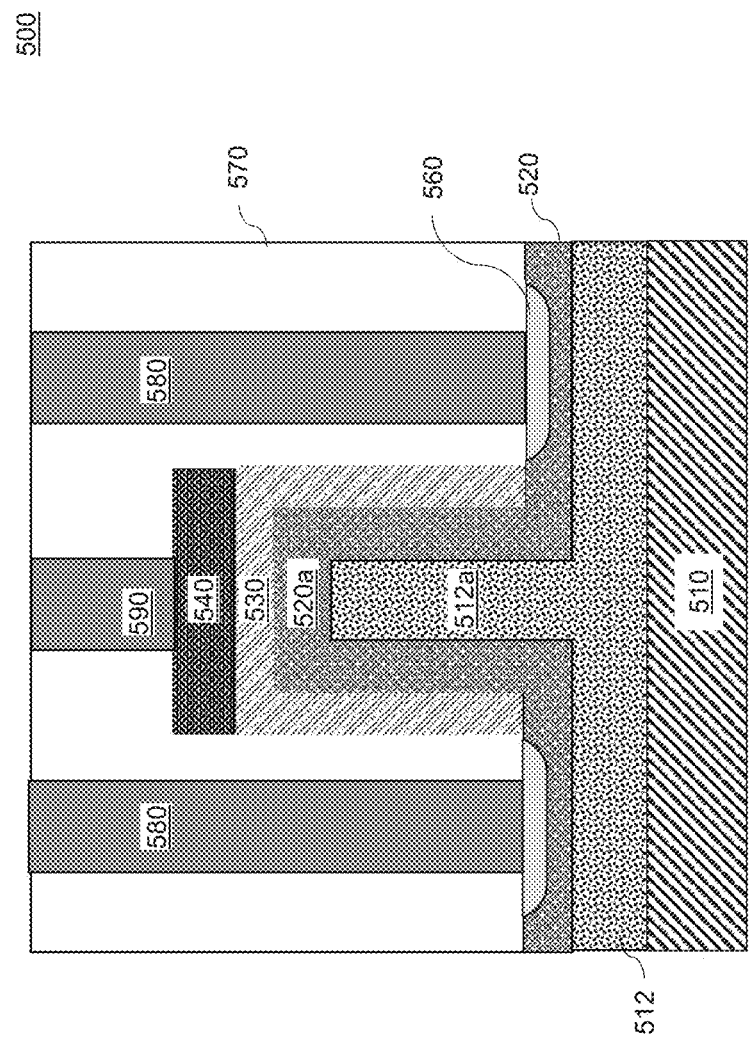
FIG. 5 illustrates an exemplary semiconductor device according to one or more embodiments.

FIG. 5 illustrates a semiconductor device 500 according to one or more embodiments. The semiconductor device 500 may include, for example, a fin-shaped field-effect transistor 500 (e.g., a finFET).

The semiconductor device 500 may include a substrate 510 that may be composed of the same materials as the substrate 210 described above. An insulating layer 512 (e.g., BOX layer) that may be composed, for example, of silicon dioxide) may be formed on the substrate 510. As illustrated in FIG. 5, the insulating layer 512 may include a fin-shaped insulating layer portion 512a that may project upward from a surface of the insulating layer 512.

The semiconductor device 500 may also include a semiconductor layer 520 that may be conformally formed on the insulating layer 512 including the fin-shaped insulating layer portion 512a of the insulating layer 512. The semiconductor layer 520 may be composed of a NiO semiconducting layer (e.g., p-type semiconducting layer).

The semiconductor device 500 may also include a gate dielectric 530 that may be conformally formed on a surface of the semiconductor layer 520. The gate dielectric 530 may be composed of the same materials as the gate dielectric 230 described above. In particular, the gate dielectric 530 may include an $AlO_x$ layer that may be formed together with the NiO layer of the semiconductor layer 520 by selective oxidation of a NiAl layer.

A gate electrode 540 may be formed on the gate dielectric 530. The gate electrode 540 may include a metal gate electrode or non-metal gate electrode.

Source and drain regions 560 may be formed in the semiconductor layer 520. A channel region 520a (e.g., p-type channel) may be located in the semiconductor layer 520 between the source and drain regions 560. That is, the channel region 520a may be formed in a portion of the semiconductor layer 520 that is formed on the fin-shaped insulating layer portion 512a of the insulating layer 512.

The semiconductor device 500 may also include a dielectric layer 570 such as an inter-layer dielectric layer. The dielectric layer 570 may be formed on the gate electrode 540, gate dielectric 530, semiconductor layer 520 and source and drain regions 560. The dielectric layer 570 may be formed of the same materials as the dielectric layer 270 described above.

Source and drain contact vias 580 may be formed in the dielectric layer 570 and contact the source and drain regions 560 (e.g., an upper surface of the source and drain regions 560). A gate contact via 590 may also be formed in the dielectric layer 570 and contact the gate electrode 540 (e.g., an upper surface of the gate electrode 540). The source and drain contact vias 580 and the gate contact via 590 may be composed of the same materials as the source and drain contact vias 280 and gate contact via 290 described above.

FIGS. 6A-6G illustrate a method of making the semiconductor device 500, according to one or more embodiments. In the method, the fin itself may just serve as a supporting structure. A dielectric isolation on top of the fin may also be envisioned. The semiconductor device 500 can, thus, be formed by conformally depositing a NiAl layer on the fin, carrying out selective oxidation, etching away the top alumina, and so on as described above.

Figure 6B:
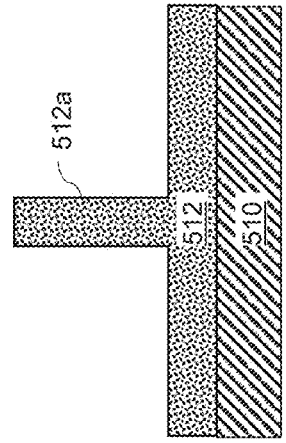
FIG. 6B illustrates an intermediate structure of the exemplary semiconductor device including the fin-shaped insulating layer portion, according to one or more embodiments.
Figure 6D:
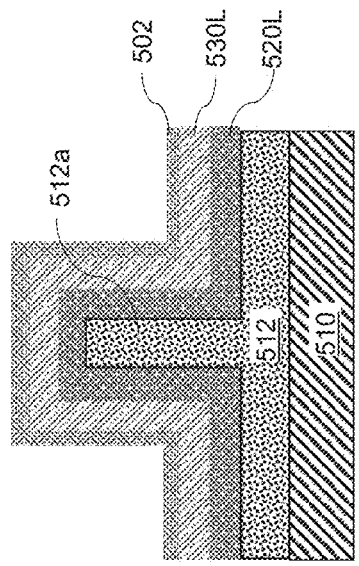
FIG. 6D illustrates an intermediate structure of the exemplary semiconductor device in which the NiAl layer is oxidized, according to one or more embodiments.
Figure 6A:
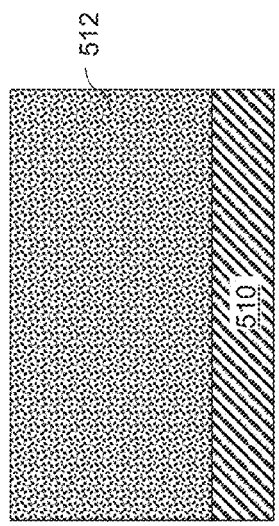
FIG. 6A illustrates an intermediate structure of the exemplary semiconductor device including an insulating layer, according to one or more embodiments.

FIG. 6A illustrates an intermediate structure including an insulating layer 512, according to one or more embodiments. The insulating layer 512 may include, for example, silicon dioxide and may be formed by deposition (e.g., CVD, ALD, PVD) onto the substrate 510. Other suitable insulating materials are within the contemplated scope of disclosure. Alternatively, the insulating layer 512 may include a BOX layer that may be formed, for example, by separation by implantation of oxygen (SIMOX) process. The insulating layer may have a thickness in a range from about 20 nm to 100 nm.

FIG. 6B illustrates an intermediate structure including the fin-shaped insulating layer portion 512a, according to one or more embodiments. The fin-shaped insulating layer portion 512a may be formed by performing a photolithographic process. The photolithographic process may include: 1) a photoresist layer may be formed on the insulating layer 512; 2) using an optical mask, the photoresist layer may be exposed to a pattern of light; 3) the photoresist layer may be developed to pattern the photoresist layer; 4) an etching process (e.g., wet etching process or dry etching process) may be performed to transfer the pattern of the patterned photoresist layer to the insulating layer 512; and 5) the patterned photoresist layer may be removed (e.g., by ashing). The patterning step may result in the formation of the fin-shaped insulating portion 512a.

Figure 6C:
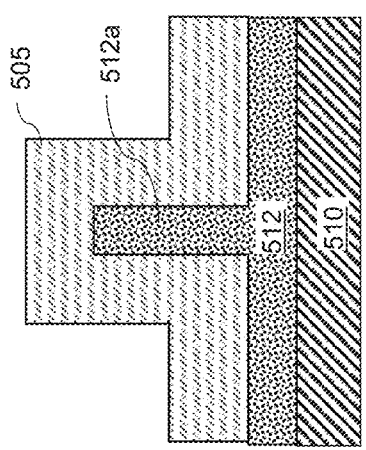
FIG. 6C illustrates an intermediate structure of the exemplary semiconductor device including the NiAl layer, according to one or more embodiments.

FIG. 6C illustrates an intermediate structure including the NiAl layer 505, according to one or more embodiments. The NiAl layer 505 may be formed on the insulating layer 512 and conformally formed on the fin-shaped insulating layer portion 512a. A thickness of the NiAl layer 505 may be, for example, in a range from about 5 nm to 100 nm. The thickness of the NiAl layer 505 may be substantially uniform across the upper surface of the insulating layer 512 and fin-shaped insulating layer portion 512a. In one or more embodiments, the NiAl layer 505 may be deposited via a variety of processes that may include, for example, CVD, ALD, PVD, etc.

FIG. 6D illustrates an intermediate structure in which the NiAl layer 505 may be oxidized, according to one or more embodiments. The NiAl layer 505 may be oxidized by the same method described above with respect to the semiconductor device 200 (e.g., see FIG. 3B).

As illustrated in FIG. 6D, the oxidation of the NiAl layer 505 may transform the NiAl layer 505 into three layers including the NiO semiconducting layer 520L, an $AlO_x$ layer 530L, and an $Al_2O_3$ layer 502 that may include amorphous $Al_2O_3+\gamma-Al_2O_3$. The NiO semiconducting layer 520L may be subsequently processed into the semiconductor layer 520. The $AlO_x$ layer 530L may be subsequently processed into the dielectric layer 530. The NiO semiconducting layer 520L, $AlO_x$ layer 530L and $Al_2O_3$ layer 502 may be similar in structure to the NiO semiconducting layer 220L, $AlO_x$ layer 230L and $Al_2O_3$ layer 302 described above in the method of making the semiconductor device 200. In addition, a thickness of each of the NiO semiconducting layer 520L, $AlO_x$ layer 530L and $Al_2O_3$ layer 502 may be substantially uniform over the surface of the insulating layer 512 including the fin-shaped insulating layer portion 512a.

Figure 6F:
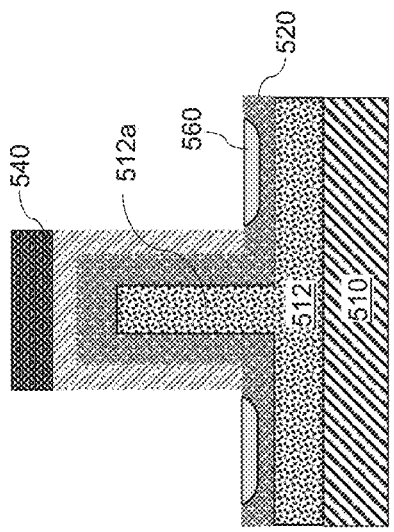
FIG. 6F illustrates an intermediate structure in which the gate electrode may be formed on the $AlO_x$ layer, according to one or more embodiments.
Figure 6G:
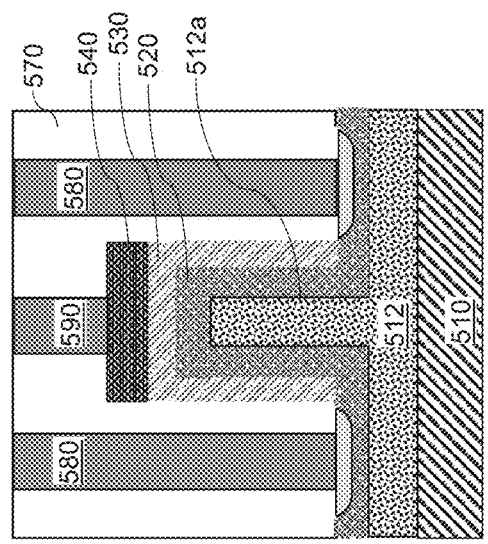
FIG. 6G illustrates an intermediate structure in which the dielectric layer (e.g., interlayer dielectric) may be formed, according to one or more embodiments.
Figure 6E:
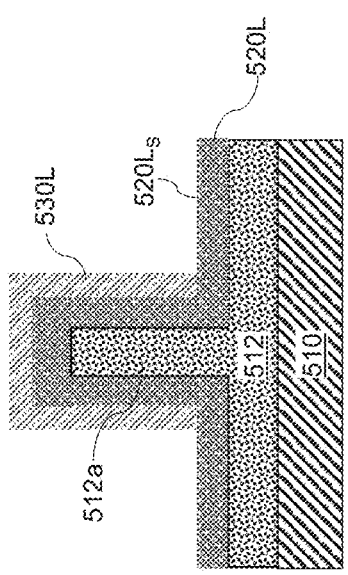
FIG. 6E illustrates an intermediate structure in which the $Al_2O_3$ layer may be removed, according to one or more embodiments.

FIG. 6E illustrates an intermediate structure in which the $Al_2O_3$ layer 502 may be removed, according to one or more embodiments. The $Al_2O_3$ layer 502 may be removed, for example, by performing an etching process or a CMP. The etching process may include a dry etching process or wet etching process. The etching process may be performed until the $Al_2O_3$ layer 302 is removed and a surface of the $AlO_x$ layer 530L is exposed.

In addition, a portion of the $AlO_x$ layer 530L may also be removed so as to expose an upper surface of the NiO semiconducting layer 520L. The portion of the $AlO_x$ layer 530L layer may be removed by performing a photolithographic process as described above.

At this point, a treatment may be performed on the $AlO_x$ layer 530L in order to improve the dielectric performance of the $AlO_x$ layer 530L. The treatment may include, for example, an oxygen-containing anneal (e.g., an $O_2$ anneal and/or an $O_3$ anneal), or an oxygen-containing plasma anneal.

FIG. 6F illustrates an intermediate structure in which the gate electrode 540 may be formed on the $AlO_x$ layer 530L, according to one or more embodiments. The gate electrode 540 may be formed by the same method described above with respect to the gate electrode 240 in FIG. 3F. The gate electrode 540 may also be composed of the same material as the gate electrode 240 discussed above.

In addition, the source and drain regions 560 maybe formed in the upper surface of the NiO semiconducting layer 520L. The source and drain regions 560 may be formed by the same method described above with respect to the source and drain regions 260 in FIG. 3G above. The source and drain regions 560 may also be composed of the same material as the source and drain regions 260.

FIG. 6G illustrates an intermediate structure in which the dielectric layer 570 (e.g., interlayer dielectric) may be formed, according to one or more embodiments. In addition, as illustrated in FIG. 6G, the source and drain contact vias 580 and gate contact via 590 may be formed.

The dielectric layer 570 may be formed by the same method and be composed of the same material as the dielectric layer 270 described above with reference to FIG. 3H. The source and drain contact vias 580 and gate contact via 590 may be formed by the same method and be composed of the same material as the source and drain contacts 280 and gate contact 290 described above, respectively. This may complete the formation of the semiconductor device 500.

It should be noted that the first alternative method and second alternative method that are described above with respect to the method of making the semiconductor device 200, may also be applied to the method of making the semiconductor device 500. That is, the method of making the semiconductor device 500 may include the further oxidation step of the first alternative method. The method of making the semiconductor device 500 may also include replacing the $AlO_x$ layer 530L with another dielectric material (e.g., a high-k dielectric material) to serve as the gate dielectric 530 as in the second alternative method.

Figure 7:
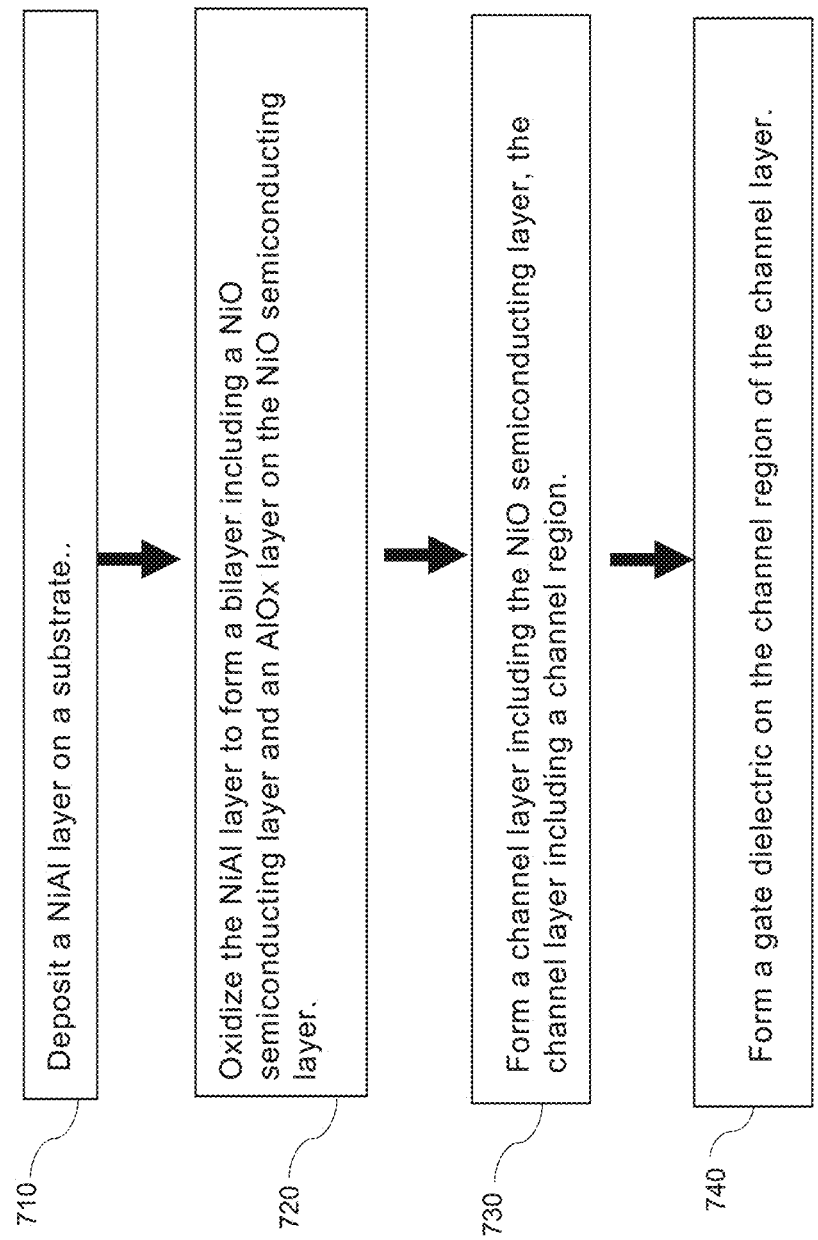
FIG. 7 is a flowchart for a method of making a semiconductor device, according to one or more embodiments.

FIG. 7 is a flowchart for a method of making a semiconductor device (e.g., semiconductor device 200, 500) according to one or more embodiments. The method may include a Step 710 of depositing a NiAl layer on a substrate, a Step 720 of oxidizing the NiAl layer to form a bilayer including a NiO semiconducting layer and an $AlO_x$ layer on the NiO semiconducting layer, a Step 730 of forming a channel layer including patterning and processing the NiO semiconducting layer into channel region, and a Step 740 of forming a gate dielectric on the channel region of the semiconducting layer.

Referring to FIGS. 2-7, a method of forming a semiconductor device 200 may include depositing a NiAl layer 305 on a substrate 210, oxidizing the NiAl layer 305 to form a bilayer including a NiO semiconducting material layer 220L, and an $AlO_x$ layer 230L on the NiO semiconducting material layer 220L, forming a semiconductor layer 220 including the NiO semiconducting material and a channel region 220a, and forming a gate dielectric 230 on the channel region 220a of the semiconductor layer 220. The oxidizing of the NiAl layer 305 may include forming the NiO semiconducting layer 220L to include a Ni:O ratio in a range between 1:1 and 1.5:1. The oxidizing of the NiAl layer 305 may include forming the NiO semiconducting layer 220L to include a Ni:O ratio between 1:1.5 and 1:1. The oxidizing of the NiAl layer 305 may include oxidizing the NiAl layer 305 in water vapor. The oxidizing of the NiAl layer 305 may be performed at a temperature in a range from 300° C. to 500° C. The forming of the gate dielectric 230 may include etching or a CMP of the $AlO_x$ layer 230L to remove $Al_2O_3$ on a surface of the $AlO_x$ layer 230L, and patterning the $AlO_x$ layer 230L to form the gate dielectric 230. The forming of the gate dielectric 230 may further include after the etching of the $AlO_x$ layer 230L to remove $Al_2O_3$ and before the patterning of the $AlO_x$ layer 230L, treating the $AlO_x$ layer 230L to improve a dielectric performance of the $AlO_x$ layer 230L. The treating of the $AlO_x$ layer 230L may include annealing the $AlO_x$ layer 230L in an oxygen-containing environment. The method may further include after the etching and/or CMP of the $AlO_x$ layer 230L to remove $Al_2O_3$ and before the patterning of the $AlO_x$ layer 230L, oxidizing the NiO semiconducting material layer 220L to increase a Ni:O ratio of the NiO semiconducting material layer 220L. The forming of the gate dielectric 230 may include etching the bilayer to remove the $AlO_x$ layer 230L and expose the NiO semiconducting material layer 220L, depositing dielectric material on the NiO semiconducting material layer 220L, and patterning the dielectric material to form the gate dielectric 230. The method may further include forming source and drain regions 260 in the semiconductor layer 220 on opposing sides of the channel region. The method may further include forming a gate electrode 240 on the gate dielectric 230, forming a dielectric layer 270 on the semiconductor layer 220 and the gate electrode 240, forming a gate contact via 290 in the dielectric layer 270 for contacting the gate electrode 270, and forming source and drain contact vias 280 in the dielectric layer 270 for contacting the source and drain regions 260, respectively.

Referring again to FIGS. 2-7, a method of forming a semiconductor device may include forming a NiAl layer 505 on a fin-shaped insulating layer, oxidizing the NiAl layer 505 to form a fin-shaped bilayer including a NiO semiconducting layer 520L and an $AlO_x$ layer on the NiO semiconducting material layer 520L, forming a semiconductor layer 520 including the NiO semiconducting material layer 520L, the semiconductor layer 520 also including a channel region 520a, and forming a gate dielectric 530 on the channel region 520a of the semiconductor layer 520. The oxidizing of the fin-shaped NiAl may include forming the NiO semiconducting material layer 520L on a side surface and upper surface of the fin-shaped insulating layer, and forming the $AlO_x$ layer on a side surface and upper surface of the NiO semiconducting material layer 520L. The oxidizing of the NiAl layer 505 may include forming the NiO semiconducting layer 520L to include a Ni:O ratio in one of a first range between 1:1 and 1.5:1 and a second range between 1:1.5 and 1:1. The oxidizing of the NiAl layer 505 may include oxidizing the NiAl layer 505 in water vapor at a temperature in a range from 300° C. to 500° C. The forming of the gate dielectric 530 may include etching the $AlO_x$ layer to remove $Al_2O_3$ on a surface of the $AlO_x$ layer. The forming of the gate dielectric 530 may further include patterning the $AlO_x$ layer to form the gate dielectric 530.

Referring again to FIGS. 2-7, a method of forming a semiconductor device may include depositing a NiAl layer 305 on a substrate, oxidizing the NiAl layer 305 in water vapor at a temperature in a range from 300° C. to 500° C. to form a bilayer including a NiO semiconducting material layer 220L having a Ni:O ratio in a range between 1:1 and 1.5:1, and an AlO$_x$ layer 230L on the NiO semiconducting material layer 220L, forming a semiconductor layer 220 including the NiO semiconducting material layer 220L, the semiconductor layer 220 including a channel region, forming a gate dielectric 230 on the channel region of the semiconductor layer 220, the forming of the gate dielectric 230 including removing Al$_2$O$_3$ from a surface of the AlO$_x$ layer 230L, treating the AlO$_x$ layer 230L to improve a dielectric performance of the AlO$_x$ layer 230L, and patterning the AlO$_x$ layer 230L to form the gate dielectric 230, forming a gate electrode on the gate dielectric 230, forming source and drain regions 260 in the semiconductor layer 220 on opposing sides of the channel region, forming a dielectric layer 270 on the semiconductor layer 220 and the gate electrode 240, forming a gate contact via 290 in the dielectric layer 270 for contacting the gate electrode 240, and forming source and drain contact vias 280 in the dielectric layer 270 for contacting the source and drain regions 260, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    depositing a NiAl layer on a substrate;
    oxidizing the NiAl layer to form a multilayer structure comprising:
        a NiO semiconducting material layer including a channel region;
        an AlO layer on the NiO semiconducting material layer; and
        an Al$_2$O$_3$ layer on the AlO layer;
    removing an entirety of the Al$_2$O$_3$ layer of the multilayer structure; and
    forming a gate dielectric on the channel region of the NiO semiconducting material layer.

2. The method of claim 1, wherein the oxidizing of the NiAl layer comprises forming the NiO semiconducting material layer to include a Ni:O ratio in a range between 1:1 and 1.5:1.

3. The method of claim 1, wherein the oxidizing of the NiAl layer comprises forming the NiO semiconducting material layer to include a Ni:O ratio between 1:1.5 and 1:1.

4. The method of claim 1, wherein the oxidizing of the NiAl layer comprises oxidizing the NiAl layer in water vapor.

5. The method of claim 1, wherein the oxidizing of the NiAl layer is performed at a temperature in a range from 300° C. to 500° C.

6. The method of claim 1, wherein the forming of the gate dielectric comprises patterning the AlO$_x$ layer to form the gate dielectric.

7. The method of claim 6, wherein the forming of the gate dielectric further comprises treating the AlO$_x$ layer to improve a dielectric performance of the AlO$_x$ layer.

8. The method of claim 7, wherein the treating of the AlO$_x$ layer comprises annealing the AlO$_x$ layer in an oxygen-containing environment.

9. The method of claim 1, further comprising oxidizing the NiO semiconducting layer to increase a Ni:O ratio of the NiO semiconducting layer.

10. The method of claim 1, wherein the forming of the gate dielectric comprises:
    removing the AlO$_x$ layer and to expose the NiO semiconducting material layer;
    depositing dielectric material on the NiO semiconducting material layer; and
    patterning the dielectric material to form the gate dielectric.

11. The method of claim 1, further comprising:
    forming source and drain regions in the NiO semiconducting material layer on opposing sides of the channel region.

12. The method of claim 11, further comprising:
    forming a gate electrode on the gate dielectric;
    forming a dielectric layer on the NiO semiconducting material layer and the gate electrode;
    forming a gate contact via in the dielectric layer for contacting the gate electrode; and
    forming source and drain contact vias in the dielectric layer for contacting the source and drain regions, respectively.

13. A method of forming a semiconductor device, the method comprising:
    forming a NiAl layer on a fin-shaped insulating layer;
    oxidizing the NiAl layer to form a fin-shaped multilayer structure comprising:
        a NiO semiconducting material layer including a channel region;
        an AlO layer on the NiO semiconducting material layer; and
        an Al$_2$O$_3$ layer on the AlO layer;
    removing an entirety of the Al$_2$O$_3$ layer of the multilayer structure; and
    forming a gate dielectric on the channel region of the NiO semiconducting material layer.

14. The method of claim 13, wherein the oxidizing of the fin-shaped NiAl comprises:
    forming the NiO semiconducting material layer on a side surface and upper surface of the fin-shaped insulating layer; and
    forming the AlO$_x$ layer on a side surface and upper surface of the NiO semiconducting material layer.

15. The method of claim 13, wherein the oxidizing of the NiAl layer comprises forming the NiO semiconducting material layer to include a Ni:O ratio in one of a first range between 1:1 and 1.5:1 and a second range between 1:1.5 and 1:1.

16. The method of claim 13, wherein the oxidizing of the NiAl layer comprises oxidizing the NiAl layer in water vapor at a temperature in a range from 300° C. to 500° C.

17. The method of claim 13, wherein the forming of the gate dielectric comprises patterning the AlO$_x$ layer to form the gate dielectric.

18. A method of forming a semiconductor device, the method comprising:
    depositing a NiAl layer on a substrate;

oxidizing the NiAl layer in water vapor at a temperature in a range from 300° C. to 500° C. to form a multilayer structure comprising:
   a NiO semiconducting material layer including a channel region and having a Ni:O ratio in a range between 1:1 and 1.5:1;
   an $AlO_x$ layer on the NiO semiconducting material layer; and
   an $Al_2O_3$ layer on the $AlO_x$ layer;
removing an entirety of the $Al_2O_3$ layer of the multilayer structure; and
forming a gate dielectric on the channel region of the NiO semiconducting material layer, the forming of the gate dielectric comprising:
   treating the $AlO_x$ layer to improve a dielectric performance of the $AlO_x$ layer; and
   patterning the $AlO_x$ layer to form the gate dielectric;
forming a gate electrode on the gate dielectric;
forming source and drain regions in the NiO semiconducting material layer on opposing sides of the channel region;
forming a dielectric layer on the NiO semiconducting material layer and the gate electrode;
forming a gate contact via in the dielectric layer for contacting the gate electrode; and
forming source and drain contact vias in the dielectric layer for contacting the source and drain regions, respectively.

19. The method of claim 1, wherein the forming of the gate dielectric comprises one of:
performing a first gate dielectric forming process including patterning the $AlO_x$ layer to form the gate dielectric; or
performing a second gate dielectric forming process including:
   removing the $AlO_x$ layer to expose the NiO semiconducting material layer;
   depositing dielectric material on the NiO semiconducting material layer; and
   patterning the dielectric material to form the gate dielectric.

20. The method of claim 1, wherein a thickness of the $Al_2O_3$ layer is less than a combined thickness of the NiO semiconducting material layer and the $AlO_x$ layer.

* * * * *